United States Patent
Bai et al.

(10) Patent No.: US 10,720,925 B2
(45) Date of Patent: Jul. 21, 2020

(54) INTEGRATED CIRCUIT

(71) Applicant: NEC CORPORATION, Tokyo (JP)

(72) Inventors: Xu Bai, Tokyo (JP); Toshitsugu Sakamoto, Tokyo (JP); Yukihide Tsuji, Tokyo (JP); Ayuka Tada, Tokyo (JP); Makoto Miyamura, Tokyo (JP); Ryusuke Nebashi, Tokyo (JP)

(73) Assignee: NEC CORPORATION, Minato-ku, Tokyo (JP)

(*) Notice: Subject to any disclaimer, the term of this patent is extended or adjusted under 35 U.S.C. 154(b) by 0 days.

(21) Appl. No.: 16/333,317

(22) PCT Filed: Sep. 11, 2017

(86) PCT No.: PCT/JP2017/032669
§ 371 (c)(1),
(2) Date: Mar. 14, 2019

(87) PCT Pub. No.: WO2018/051946
PCT Pub. Date: Mar. 22, 2018

(65) Prior Publication Data
US 2019/0253057 A1 Aug. 15, 2019

(30) Foreign Application Priority Data
Sep. 16, 2016 (JP) ................. 2016-181942

(51) Int. Cl.
H03K 19/17756 (2020.01)
H03K 19/177 (2020.01)
(Continued)

(52) U.S. Cl.
CPC ....... H03K 19/17756 (2013.01); G06F 30/33 (2020.01); G11C 13/003 (2013.01);
(Continued)

(58) Field of Classification Search
CPC ......... H03K 19/17756; H03K 19/1776; H03K 19/17728; H03K 19/177; H03K 17/693;
(Continued)

(56) References Cited

U.S. PATENT DOCUMENTS 7,859,739 B2 * 12/2010 Chui ............... G09G 3/3466
326/104
2007/0069784 A1 3/2007 Shin et al.
(Continued)

FOREIGN PATENT DOCUMENTS

JP 09-135358 A 5/1997
JP 10-228780 A 8/1998
(Continued)

OTHER PUBLICATIONS

Makoto Miyamura et al., "Low-power programmable-logic cell arrays using nonvolatile complementary atom switch", 15th International Symposium on Quality Electronic Design (ISQED), 2014, pp. 330-334.
(Continued)

Primary Examiner — Don P Le
(74) Attorney, Agent, or Firm — Sughrue Mion, PLLC

(57) ABSTRACT

Provided is an integrated circuit that has reduced power consumption. The integrated circuit is provided with: a plurality of first wires one end of each of which is used as an input terminal; a plurality of second wires one end of each of which is used as an output terminal and which are respectively connected to the first wires; a bias wire which is connected to each of the second wires, and which is connected to a power supply or ground; a plurality of switches which connect the first wires or the bias wire and the second wires; and a selection circuit which selects electrical connection between the bias wire and the power supply or ground.

11 Claims, 12 Drawing Sheets

(51) Int. Cl.
*H03K 17/693* (2006.01)
*G06F 30/33* (2020.01)
*G11C 13/00* (2006.01)
*H03K 19/17728* (2020.01)
*H03K 19/1776* (2020.01)
*G06F 30/331* (2020.01)

(52) U.S. Cl.
CPC ......... *H03K 17/693* (2013.01); *H03K 19/177* (2013.01); *H03K 19/1776* (2013.01); *H03K 19/17728* (2013.01); *G06F 30/331* (2020.01)

(58) Field of Classification Search
CPC ............... G11C 13/003; G06F 17/5022; G06F 17/5027
USPC .......................................................... 326/41
See application file for complete search history.

(56) References Cited

U.S. PATENT DOCUMENTS

| | | | |
|---|---|---|---|
| 2013/0207689 A1* | 8/2013 | Bansal | H03K 19/01858 326/82 |
| 2014/0225646 A1* | 8/2014 | Pickett | G11C 8/10 326/105 |
| 2015/0138877 A1 | 5/2015 | Nebashi et al. | |
| 2016/0043724 A1 | 2/2016 | Lewis | |
| 2017/0141125 A1 | 5/2017 | Tada | |
| 2019/0196030 A1* | 6/2019 | Yang | G01T 1/2006 |

FOREIGN PATENT DOCUMENTS

| | | |
|---|---|---|
| JP | 11-136119 A | 5/1999 |
| JP | 2006-340096 A | 12/2006 |
| JP | 2007-097136 A | 4/2007 |
| JP | 2013-236082 A | 11/2013 |
| WO | 2013/187193 A1 | 12/2013 |
| WO | 2015/198573 A1 | 12/2015 |

OTHER PUBLICATIONS

Xu Bai et al., "Area-efficient nonvolatile carry chain based on pass-transistor/atom-switch hybrid logic", Japanese Journal of Applied Physics, Mar. 1, 2016, 55(4S), 04EF01.
Toshitsugu Sakamoto et al., "A Silicon-on-Thin-Buried-Oxide CMOS Microcontroller with Embedded Atom-Switch ROM", IEEE Micro, 2015, pp. 13-23, vol. 35, No. 6.
International Search Report of PCT/JP2017/032669 dated Nov. 28, 2017 [PCT/ISA/210].
Written Opinion of PCT/JP2017/032669 dated Nov. 28, 2017 [PCT/ISA/237].

* cited by examiner

INTEGRATED CIRCUIT

CROSS REFERENCE TO RELATED APPLICATIONS

This application is a National Stage of International Application No. PCT/JB2017/032669, filed Sep. 11, 2017, claiming priority to Japanese Patent Application No. 2016-181942, filed Sep. 16, 2016, the contents of all of which are incorporated herein by reference in their entirety.

TECHNICAL FIELD

The present invention relates to an integrated circuit.

BACKGROUND ART

An integrated circuit that can be reconfigured is used as one example of an integrated circuit. The integrated circuit that can be reconfigured is constituted to be various logic circuits by rewriting internal setting information. For such a characteristic, the integrated circuit that can be reconfigured is used in various fields in such a way as to be used for producing a prototype and used as a circuit for image processing, communication or the like, for example.

Further, a variable resistance element is being used as a memory cell and a switch included in the integrated circuit. The variable resistance element is also called a variable-resistance nonvolatile element. The variable resistance element transits between a state of a high resistance value and a state of a low resistance value by application of voltage or current and the like. A resistance value of the variable resistance element is held in a nonvolatile manner. A chip area and power consumption can be reduced by replacing a memory cell and a switch included in the integrated circuit with the variable resistance element. The same technique is also described in Non Patent Literature 1 (NPL1).

Patent Literature 1 (PTL1) describes an example of a reconfiguration circuit chip using a variable resistance element. In the example described in PTL1, the variable resistance element is used as a routing switch or a memory.

Further, Patent Literature 2 (PTL2) to Patent Literature 4 (PTL4) each describe an example of a variable resistance element. PTL2 describes an example of a resistive random access memory (ReRAM). Patent Literature 3 (PTL3) describes an example of a phase change random access memory (PRAM). Further, Patent Literature 4 (PTL4) describes a resistive random access memory having a resistance value to be changed by controlling, with an applied voltage, generation/disappearance of a bridge, which is called NanoBridge (registered trademark), formed by a metal atom in a solid electrolyte.

CITATION LIST

Patent Literature

[PTL1] International Patent Publication No. WO2015/198573
[PTL2] Japanese Patent Application Laid-open No. 2006-340096
[PTL3] Japanese Patent Application Laid-open No. H10-228780
[PTL4] Japanese Patent Application Laid-open No. H09-135358

Non Patent Literature

[NPL1] Makoto Miyamura et al., Low-power programmable-logic cell arrays using nonvolatile complementary atom switch, ISQED 2014, pp. 330-334.
[NPL2] Xu Bai et al., Area-efficient nonvolatile carry chain based on pass-transistor/atom-switch hybrid logic, Jpn. J. Appl. Phys. 55 (4S), 04EF01, 2016-03-01.
[NPL3] Toshitsugu Sakamoto et al., A Silicon-on-Thin-Buried-Oxide CMOS Microcontroller with Embedded Atom-Switch ROM, IEEE Micro, vol. 35, No. 06, pp. 13-23.

SUMMARY OF INVENTION

Technical Problem

An integrated circuit including the above-described reconfigurable integrated circuit preferably achieves reduced power consumption. In other words, further reduction in power consumption is required for an integrated circuit using each prior art literature.

The present invention has been made in order to solve the above-mentioned problem, and a main object of the present invention is to provide an integrated circuit with reduced power consumption.

Solution to Problem

An integrated circuit in an embodiment of the present invention, comprises: a plurality of first wires each having one end used as an input terminal; a plurality of second wires that each have one end used as an output terminal and are each connected to each of the first wires; a bias wire connected to each of the second wires and connected to a power supply or a ground; a plurality of switches that connect the first wires or the bias wire to the second wires; and a selection circuit that selects an electrical connection between the bias wire and either the power supply or the ground.

Advantageous Effects of Invention

According to the present invention, an integrated circuit with reduced power consumption can be provided.

EXAMPLE EMBODIMENT

Figure 1:
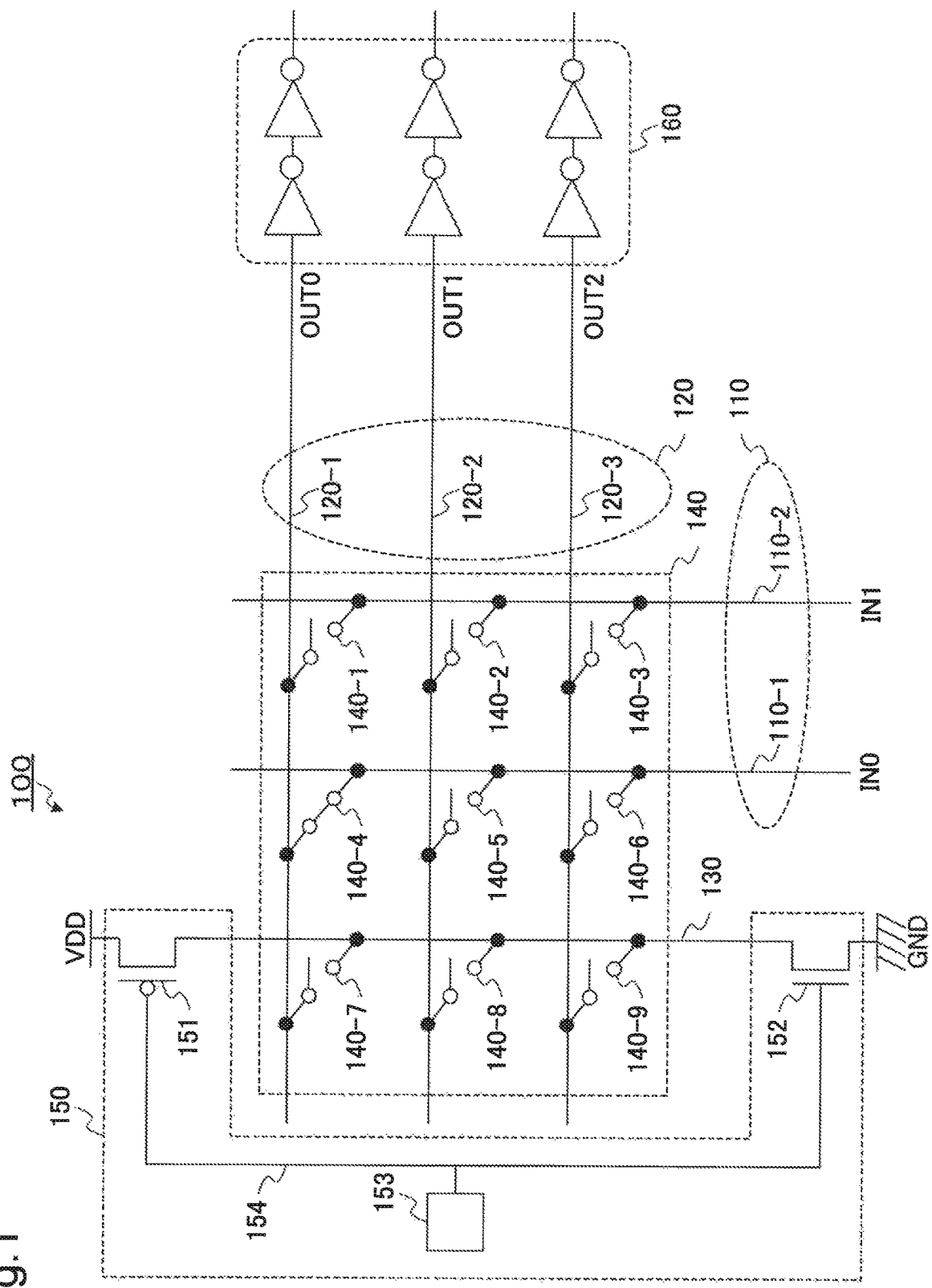
FIG. 1 is a diagram illustrating an integrated circuit in a first example embodiment of the present invention.
Figure 2:
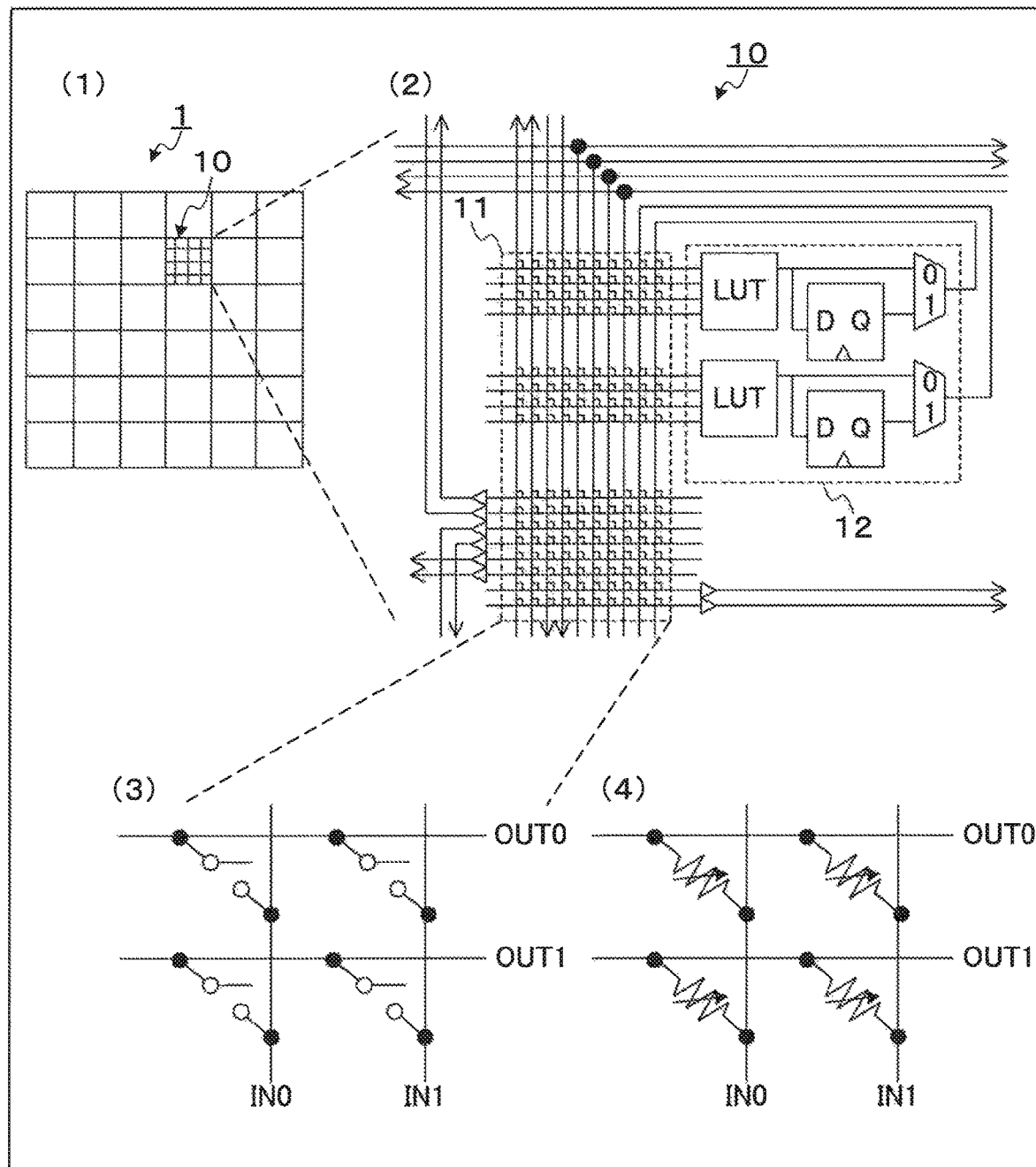
FIG. 2 is a diagram illustrating a reconfigurable integrated circuit including the integrated circuit in the first example embodiment of the present invention.

Each example embodiment of the present invention is described with reference to accompanying drawings. First, a first example embodiment of the present invention is described. FIG. 1 is a diagram illustrating an integrated circuit in the first example embodiment of the present invention. Further, FIG. 2 is a diagram illustrating a reconfigurable integrated circuit in which the integrated circuit in the first example embodiment of the present invention is used.

As illustrated in FIG. 1, an integrated circuit 100 in the first example embodiment of the present invention includes, as main elements, a plurality of first wires 110, a plurality of second wires 120, a bias wire 130, a plurality of switches 140, and a selection circuit 150. The plurality of first wires 110, the plurality of second wires 120, and the plurality of switches 140 constitute a crossbar switch.

The plurality of first wires 110 each have one end used as an input terminal of the crossbar switch. In the example illustrated in FIG. 1, two wires of first wires 110-1 and 110-2 are provided as the plurality of first wires 110. One ends of the respective first wires 110-1 and 110-2 are used as input terminals IN0 and IN1, respectively. The plurality of second wires 120 are each connected to each of the plurality of first wires 110 via the plurality of switches 140 described later, and each have one end used as an output terminal of the crossbar switch. In the example illustrated in FIG. 1, three wires of second wires 120-1 to 120-3 are provided as the plurality of second wires 120. One ends of the respective second wires 120-1 to 120-3 are used as output terminals OUT0 to OUT2, respectively. The bias wire 130 is connected to each of the plurality of second wires 120, a power supply, and a ground via the plurality of switches 140 described later. The bias wire 130 becomes a potential of the power supply or a potential of the ground depending on selection of the selection circuit 150. The plurality of switches 140 each connect each of the plurality of first wires 110 and the bias wire 130 to each of the plurality of second wires 120. In the example illustrated in FIG. 1, nine switches of switches 140-1 to 140-9 are provided as the plurality of switches 140. The selection circuit 150 selects an electrical connection between the bias wire 130 and the power supply or the ground. In the example illustrated in FIG. 1, the selection circuit 150 includes a metal oxide semiconductor (PMOS) transistor 151, an NMOS transistor 152, and a control memory 153. The PMOS transistor 151 or the NMOS transistor 152 is connected to the control memory 153 via a selection wire 154.

As one example, the integrated circuit 100 in the present example embodiment is applied as a part of a reconfigurable integrated circuit. The reconfigurable integrated circuit is an integrated circuit that allows change of a circuit configuration by a user, and is, for example, a field programmable gate array (FPGA).

FIG. 2 illustrates an example of a reconfigurable integrated circuit 1. In the example illustrated in FIG. 2, the reconfigurable integrated circuit 1 is constituted of a routing block 11 and a logic block 12 arranged regularly. In the present example embodiment, a unit of an integrated circuit including one routing block 11 and one logic block is referred to as a cell 10. In other words, the reconfigurable integrated circuit 1 is constituted of a plurality of cells 10 arranged regularly. The integrated circuit 100 in the present example embodiment is used as the routing block 11 in the cell 10.

A state where the plurality of cells 10 are regularly arranged as the reconfigurable integrated circuit 1 is illustrated as (1) of FIG. 2. An individual rectangular portion included in (1) of FIG. 2 represents one cell 10. In the example illustrated in (1) of FIG. 2, 36 numbers of cell 10 are included in the reconfigurable integrated circuit 1. In other words, in this example, the cells 10 in six rows in a row direction and in six columns in a column direction in the diagram are two-dimensionally arranged in an array pattern. Note that, the number of the cells 10 included in the reconfigurable integrated circuit 1 is not particularly limited.

One example of a configuration of an individual cell 10 is illustrated as (2) of FIG. 2. The routing block 11 is constituted of a crossbar switch circuit. In other words, as one example, the routing block 11 includes one wire group, another wire group intersecting the one wire group, and a switch that connects these wire groups. Further, as one example, the logic block 12 includes a look up table (LUT), a flip-flop, a multiplexer and the like. A circuit having a configuration desired by a user of the reconfigurable integrated circuit 1 is achieved by appropriately setting a connection relationship of the routing block 11, the LUT and the like.

Further, an example of a part of the routing block 11 is illustrated as (3) of FIG. 2. In this example, two input signal lines are each connected to each of two output signal lines via switches. When the integrated circuit 100 is used as the routing block 11, the input signal line, the output signal line, the switch that connects the input signal line to the output signal line respectively correspond to each of the plurality of first wires 110, each of the plurality of second wires 120, and the switch 140. Note that, the switch included in the routing block 11 may be a variable resistance element as illustrated in (4) of FIG. 2.

Next, details of each component of the integrated circuit 100 in the first example embodiment of the present invention are described.

One end of each of the plurality of first wires 110 is used as an input terminal. In the example illustrated in FIG. 1, the two wires of the first wires 110-1 and 110-2 are provided as the plurality of first wires 110. Further, in this example, one end of the first wire 110-1 is used as the input terminal IN0 of the crossbar switch, and one end of the first wire 110-2 is used as the input terminal IN1 of the crossbar switch.

The plurality of second wires 120 are each connected to each of the plurality of first wires 110 via the switch 140 described later. Further, one end of each of the plurality of second wires 120 is used as an output terminal. In the example illustrated in FIG. 1, the three wires of the second wires 120-1 to 120-3 are provided as the plurality of second wires 120. Each of the second wires 120-1 to 120-3 is connected to the first wires 110-1 and 110-2 via the switch 140 described later. Further, one ends of the second wires 120-1 to 120-3 are used as the output terminals OUT0 to OUT2 of the crossbar switch, respectively. Note that, in the example illustrated in FIG. 1, each of the output terminals of the second wires 120 is connected to a buffer 160 described later.

The bias wire 130 is connected to each of the plurality of second wires 120 via the switches 140 described later. Further, the bias wire 130 is electrically connected to a power supply VDD or a ground GND via the PMOS transistor 151 or the NMOS transistor 152, respectively, included in the selection circuit 150 described later. As described later, the bias wire 130 is connected to the power supply VDD or the ground GND in such a way as to become a potential of any of the power supply VDD or the ground GND depending on selection of the selection circuit 150. Further, each of the plurality of second wires 120 may be a potential similar to the potential of the bias wire 130 depending on connection with the switch 140. In other words, the output terminal of the second wire 120 is prevented from a so-called floating state by providing the bias wire 130.

The plurality of switches 140 each connect any of the first wires 110 and the bias wire 130 to any of the second wires 120. In the example illustrated in FIG. 1, the nine switches 140 of the switches 140-1 to 140-9 are provided. The switches 140-1 to 140-6 each connect each of the first wires 110 to each of the second wires 120. The switches 140-7 to 140-9 each connect the second wire 120 to the bias wire 130.

Figure 3:
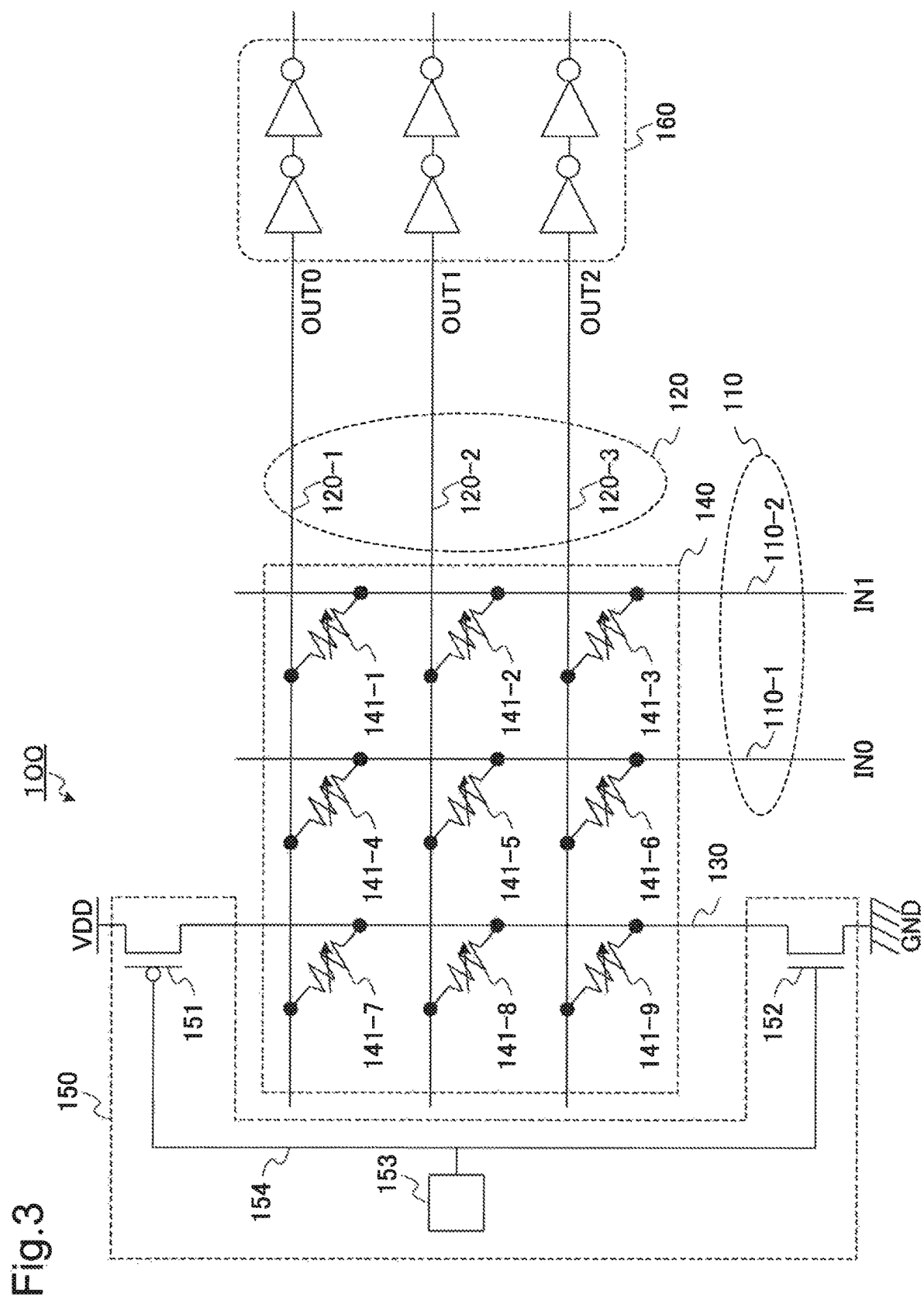
FIG. 3 is a diagram illustrating an example in which a plurality of switches are achieved by variable resistance elements in the integrated circuit in the first example embodiment of the present invention.

Each of the plurality of switches 140 may be a switch of a complementary metal oxide semiconductor (CMOS) or a variable resistance element. As described above, the variable resistance element transits between a state of a high resistance value and a state of a low resistance value by application of voltage or current or the like. When the variable resistance elements are used as the plurality of switches 140, the state of a great resistance value is a state (OFF state) where the variable resistance element is opened as a switch, and the state of a small resistance value is a state (state to be ON) where the variable resistance element is closed as a switch. Power consumption of the integrated circuit 100 can be reduced by using the variable resistance elements as the plurality of switches 140. FIG. 3 illustrates an example in which variable resistance elements 141 are used as the plurality of switches 140 of the integrated circuit 100.

The selection circuit 150 selects a connection between the bias wire 130 and the power supply VDD or the ground GND. The bias wire 130 is electrically connected to any one of the power supply VDD and the ground GND depending on selection of the selection circuit 150. In other words, a potential of the bias wire 130 becomes a potential of any of a high potential and a low potential associated with the power supply or the ground, depending on selection of the selection circuit 150.

In the present example embodiment, the selection circuit 150 includes the control memory 153, the PMOS transistor 151, and the NMOS transistor 152. Each gate electrode of the PMOS transistor 151 or the NMOS transistor 152 is connected to the control memory 153 via the selection wire 154. The PMOS transistor 151 is provided between the power supply VDD and the bias wire 130. In other words, the PMOS transistor 151 operates as a switch that switches an electrical connection between the bias wire 130 and the power supply VDD.

Further, the NMOS transistor 152 is provided between the bias wire 130 and the ground GND. In other words, the NMOS transistor 152 operates as a switch that switches an electrical connection between the ground and the bias wire 130.

Note that, the PMOS transistor 151 and the NMOS transistor 152 may be collectively referred to as a selection switch that switches a connection between the bias wire 130 and the power supply or the ground.

The control memory 153 controls opening and closing of the PMOS transistor 151 and the NMOS transistor 152 being the selection switch. In other words, the control memory 153 controls opening and closing of the PMOS transistor 151 and the NMOS transistor 152 in such a way that the bias wire 130 is electrically connected to any of the power supply VDD and the ground GND. A value held in the control memory 153 is transmitted to each gate electrode of the PMOS transistor 151 or the NMOS transistor 152 via the selection wire 154. In other words, opening and closing of the PMOS transistor 151 or the NMOS transistor 152 are controlled according to a value held in the control memory 153.

For example, when a value held in the control memory 153 is "0" (low potential), the PMOS transistor 151 is connected and the NMOS transistor 152 is cut off. In this case, the bias wire 130 becomes a high potential. Further, when a value held in the control memory 153 is "1" (high potential), the NMOS transistor 152 is connected and the PMOS transistor 151 is cut off. In this case, the bias wire 130 becomes a low potential. Note that, it is assumed in the description of each example embodiment that "0" is associated with a low potential being a potential of the ground GND and "1" is associated with a high potential being a potential of the power supply VDD.

In other words, a connection of the bias wire 130 is changed according to a value (potential) held in the control memory 153. In other words, the bias wire 130 is electrically connected to any of the power supply and the ground according to a value (potential) held in the control memory 153. As a result, a potential of the bias wire 130 becomes any of a high potential and a low potential.

Note that, the configuration of the selection circuit 150 described above is one example, and a circuit having another configuration may be used. The selection circuit 150 may be able to perform control in such a way that the bias wire 130 is electrically connected to any one of the power supply and the ground. Further, the NMOS transistor 152 may be provided between the power supply VDD and the bias wire 130, and the PMOS transistor 151 may be provided between the bias wire 130 and the ground GND. Another element or the like functioning as a switch that connects the bias wire 130 to any one of the power supply and the ground may be used instead of each of the PMOS transistor 151 and the NMOS transistor 152. Further, a configuration of a circuit of the control memory 153 is not particularly limited. A circuit having a configuration different from that of a memory may be used, as the control memory 153, as long as control of an electrical connection to any one of the PMOS transistor 151 and the NMOS transistor 152 can be performed. An example of a circuit of the control memory 153 is described later.

Operation of Integrated Circuit 100

Next, an operation of the selection circuit 150 of an operation and the like of the integrated circuit 100 in the present example embodiment is mainly described. In the following description, an operation of the integrated circuit 100 is compared, as necessary, with an operation and the like of a circuit (namely, a circuit that does not include a circuit corresponding to the selection circuit 150) in which the bias wire 130 is directly connected to any of the power supply and the ground.

Figure 4:
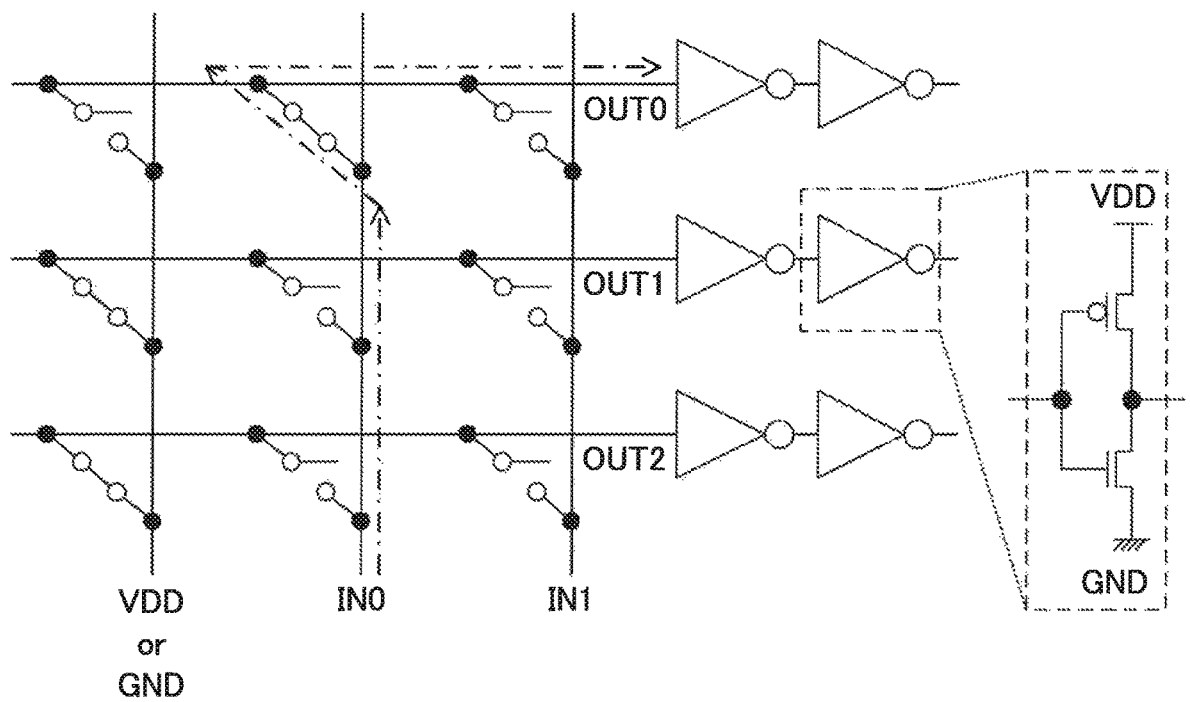
FIG. 4 is a diagram illustrating an example of a crossbar switch circuit as a comparative example of the integrated circuit in the first example embodiment of the present invention.

An example of a crossbar switch circuit as a comparative example is illustrated in FIG. 4. In the crossbar switch circuit illustrated in FIG. 4, each of two wires on an input side having one ends as inputs is connected to each of three wires on an output side having one ends as outputs via a switch. In the example of FIG. 4, the input terminal is indicated by "IN0" or "IN1". The output terminal is indicated by "OUT0", "OUT1", or "OUT2". The wires on the input side correspond to the plurality of first wires 110 in the integrated circuit 100, and the wires on the output side correspond to the plurality of second wires 120 in the integrated circuit 100. Further, the switches that connect the wires on the input side to the wires on the output side correspond to the plurality of switches 140 in the integrated circuit 100. In the example of FIG. 4, for example, a variable resistance element is used as the switch. However, a kind of the switch is not particularly limited.

In the crossbar switch circuit illustrated in FIG. 4, magnitude of resistances of the switch and the wire is not zero. Then, a voltage of a signal from the output may decrease due to these resistances. Thus, in the example illustrated in FIG. 4, a buffer is connected to each of the output terminals. In the example illustrated in FIG. 4, the buffer is constituted of two inverter circuits connected in series. The buffer prevents a false value from being output from the output terminal due to a decrease in voltage.

On the other hand, all the switches connected to the wires on the output side may turn OFF (that is, may be brought into an opened state) in the crossbar switch circuit. In this case, the wires are brought into a floating state, and a potential may become indeterminate.

Thus, as illustrated in FIG. 4, a bias wire may be provided to the crossbar switch circuit. The bias wire is connected to any of a power supply VDD and a ground GND. In other words, the bias wire becomes a potential of any of the power supply VDD and the ground GND. Further, the bias wire is connected to the wires on the output side via the switches. Then, of the wire on the output side with all the switches connected to the wires on the input side being OFF (opened), the switch connected to the bias wire turns ON (that is, the switch is brought into a closed state). By determining opening and closing of the switch in this way, the output of the wire on the output side described above is brought into a state of any of a high potential and a low potential. In other words, a value of a high potential or a low potential is input to the buffer. Occurrence of a floating state is avoided by such an operation.

Figure 5:
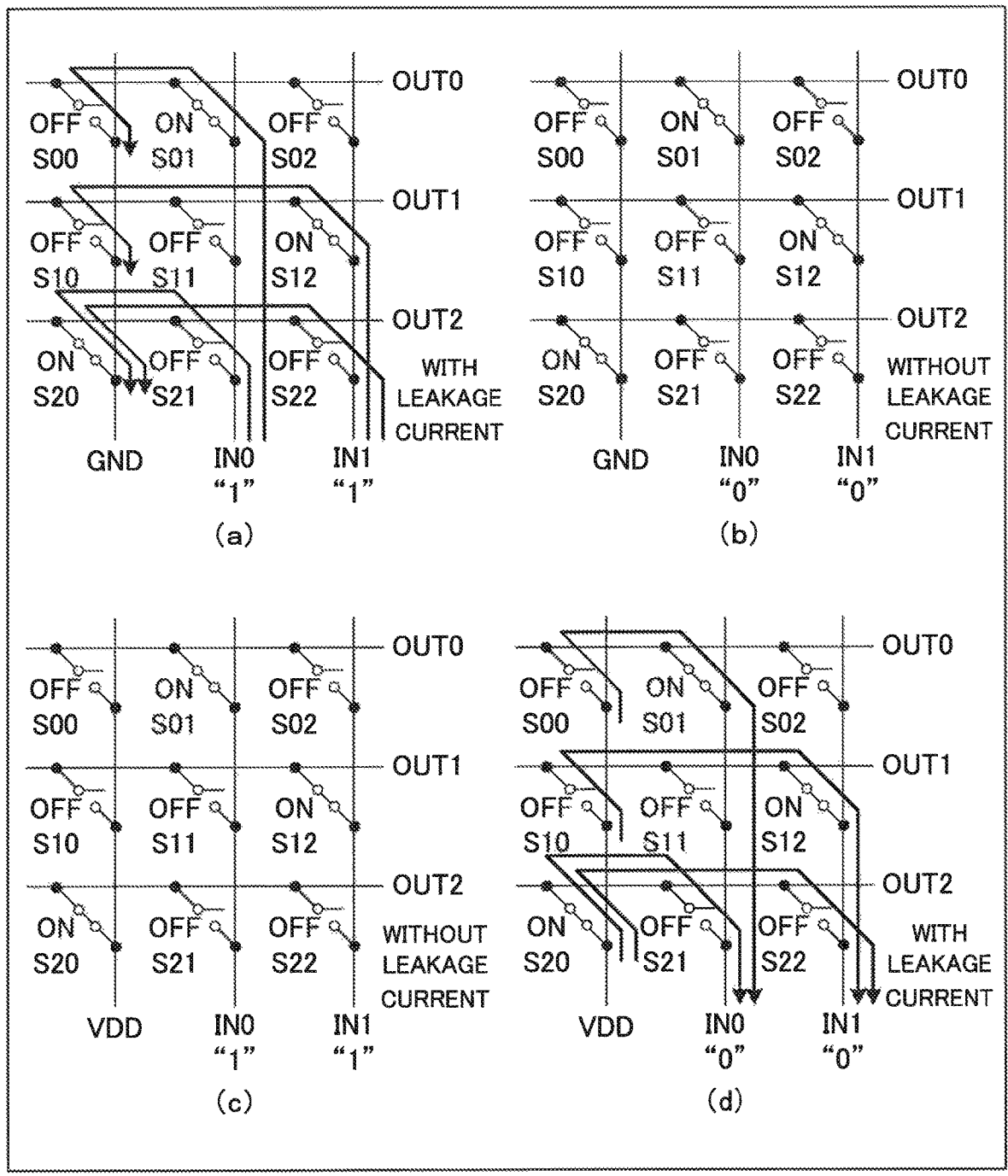
FIG. 5 is a diagram illustrating an example in which a leakage current is generated in the crossbar switch circuit as a comparative example of the integrated circuit in the first example embodiment of the present invention.

However, a leakage current may be generated, due to the presence of the bias wire, in the crossbar switch circuit illustrated in FIG. 4. FIG. 5 illustrates one example in which a leakage current is generated.

In the example illustrated in FIG. 5 similarly to the example illustrated in FIG. 4, each of two wires on an input side having one ends as inputs is connected to each of three wires on an output side having one ends as outputs via a switch. In the example of FIG. 5, the input terminal is indicated by "IN0" or "IN1". The output terminal is indicated by "OUT0", "OUT1", or "OUT2". The wires on the input side correspond to the plurality of first wires 110 in the integrated circuit 100, and the wires on the output side correspond to the plurality of second wires 120 in the integrated circuit 100. It is assumed that a buffer, which is not illustrated, is connected to each of the output terminals. Further, while a kind of the switch is not particularly limited, the switch is a variable resistance element, for example.

(a) and (b) of FIG. 5 are examples in which a bias wire is connected to a ground GND. In these cases, the bias wire becomes a low potential. Further, it is assumed in these cases that switches S01 and S12 are ON. Thus, a path from IN0 to OUT0 and a path from IN1 to OUT1 are constituted. Further, it is assumed that a switch S20 is ON in order to avoid a problem of the above-described floating. Accordingly, an output OUT2 becomes a low potential.

In this case, it is assumed that a value input from IN0 and IN1 is "1", that is, a high potential. In this case, the wire on the input side and the bias wire have a potential difference therebetween. Thus, as illustrated in (a) of FIG. 5, a leakage current via switches S00, S10, S21, and S22 in an OFF state is generated.

On the other hand, it is assumed that a value input from IN0 and IN1 is "0", that is, a low potential. In this case, it can be considered that the wire on the input side and the bias wire do not have a potential difference therebetween. Thus, as illustrated in (b) of FIG. 5, a leakage current via the switches S00, S10, S21, and S22 in the OFF state is not generated.

Further, (c) and (d) of FIG. 5 are examples in which the bias wire is connected to a power supply VDD. In these cases, the bias wire becomes a high potential. Further, it is assumed in these cases that the switches S01 and S12 are ON, similarly to the above-described example. Thus, a path from IN0 to OUT0 and a path from IN1 to OUT1 are constituted. Further, it is assumed that the switch S20 is ON in order to avoid a problem of the above-described floating. Accordingly, the output OUT2 becomes a high potential.

In this case, it is assumed that a value input from IN0 and IN1 is "1", that is, a high potential. In this case, it can be considered that the wire on the input side and the bias wire do not have a potential difference therebetween. Thus, as illustrated in (c) of FIG. 5, a leakage current via the switches S00, S10, S21, and S22 in the OFF state is not generated.

On the other hand, it is assumed that a value input from IN0 and IN1 is "0", that is, a low potential. In this case, the wire on the input side and the bias wire have a potential difference therebetween. Thus, as illustrated in (d) of FIG. 5, a leakage current via the switches S00, S10, S21, and S22 in the OFF state is generated.

In other words, a leakage current may be generated when the wire on the input side and the bias wire have a potential difference therebetween, in the crossbar switch circuit illustrated in FIG. 5. More specifically, a leakage current may be generated when the bias wire is connected to the power supply VDD and the input from the wire on the input side is "0" (low potential). A leakage current may also be generated when the bias wire is connected to the ground and the input from the wire on the input side is "1" (high potential).

The integrated circuit 100 in the present example embodiment includes the selection circuit 150, and can thus select whether the bias wire 130 is electrically connected to the power supply or the ground as described above. Then, the selection circuit 150 performs selection in such a way that a potential difference between the bias wire 130 and the plurality of first wires 110 associated with the signal on the input side in the above-described example is less likely to occur, and thus a leakage current can be reduced.

Whether the selection circuit 150 selects the power supply or the ground is determined according to a value of a signal input to the plurality of first wires 110 constituting a crossbar switch as one example.

As one example, when a signal to be input includes many "0", the selection circuit 150 selects in such a way as to connect the bias wire 130 to the ground. In other words, "1" is held in the control memory 153 of the selection circuit 150. Further, when a signal to be input includes many "1", the selection circuit 150 selects in such a way as to connect the bias wire 130 to the power supply. In other words, "0" is held in the control memory of the selection circuit 150. By such determination, a leakage current due to the bias wire 130 can be reduced.

Method of Determining Potential Selected by Selection Circuit 150

Next, a method of determining whether the selection circuit 150 selects the power supply or the ground, that is, a method of determining a potential selected by the selection circuit 150 is described. More specifically, a method of determining a value held in the control memory 153 of the selection circuit 150 is described.

Note that, in description of the method of determining whether the selection circuit 150 selects the power supply or the ground, it is assumed that the integrated circuit 100 is used as the routing block 11 included in the cell 10 of the reconfigurable integrated circuit 1. In this case, for example, a circuit achieved by the reconfigurable integrated circuit 1 is generated, and a value held in the control memory 153 of the selection circuit 150 is also determined.

Figure 6:
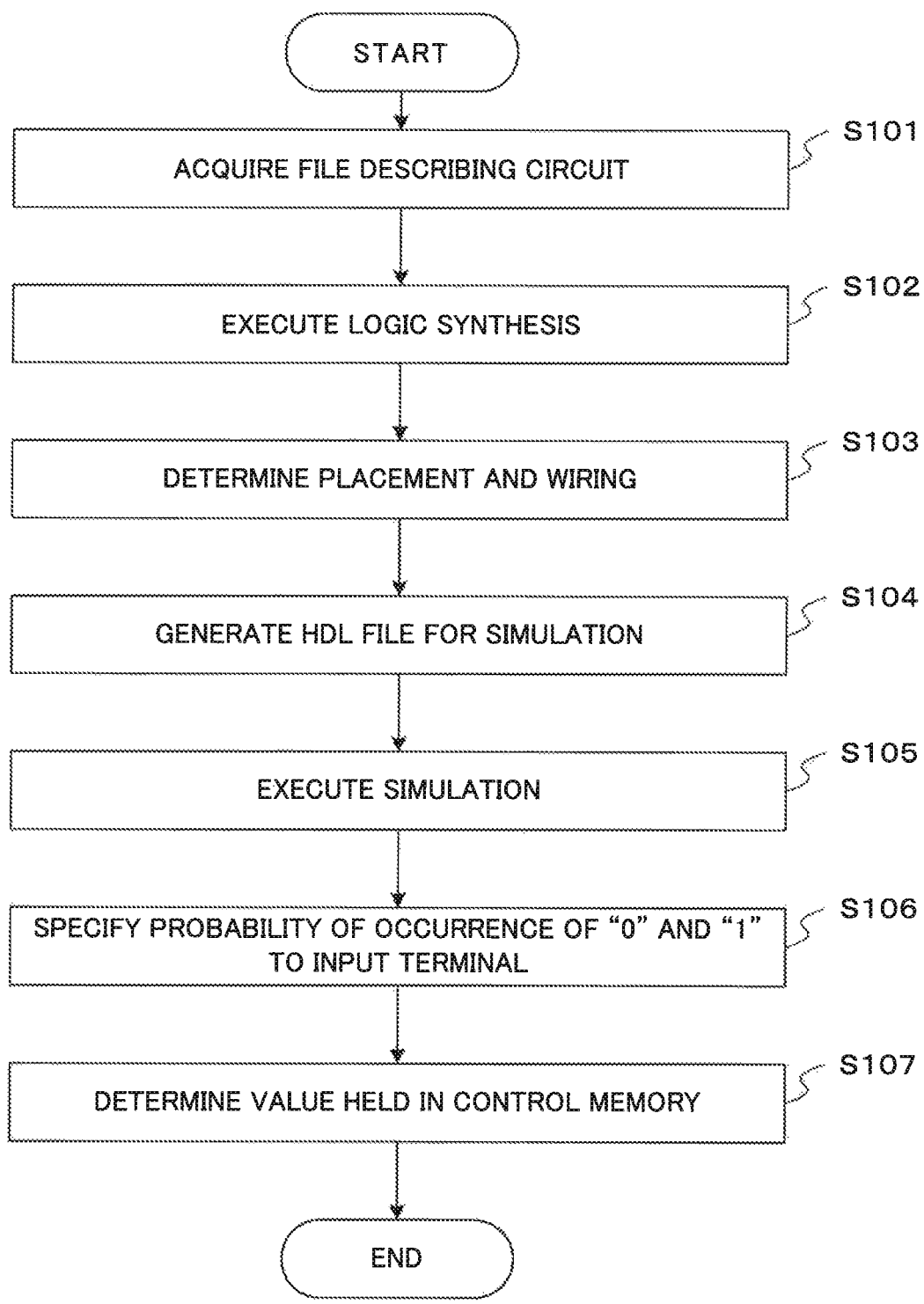
FIG. 6 is a flowchart illustrating one example of a method of designing a circuit constituted in the reconfigurable integrated circuit including the integrated circuit in the first example embodiment of the present invention.

In this case, a value held in the control memory 153 is determined as in a flowchart illustrated in FIG. 6 as one example. The flowchart illustrated in FIG. 6 is performed by using a design support tool of one or more circuits and the like, for example.

First, a file that describes a circuit achieved by the reconfigurable integrated circuit 1 is acquired (Step S101). In this case, the circuit is described in hardware description language such as Verilog-hardware description language (HDL) and VHDL (VHSIC HDL), for example.

Next, a logic synthesis is executed by logic synthesis software or the like on the file acquired in Step S101 (Step S102). As a result of the logic synthesis, a netlist that describes a connection relationship between circuit elements is generated. In this case, an LUT and a flip-flop constituting the logic block 12 serve as elements included in the netlist. Further, the netlist includes information about a truth value of an LUT included in the logic block 12.

Next, physical placement and wiring in the reconfigurable integrated circuit 1 are determined by a placement and wiring tool, based on the netlist generated in Step S102 (Step S103). In other words, physical placement in the reconfigurable integrated circuit 1 of circuit elements described in the netlist is determined by a placement and wiring tool. Further, a connection between circuit elements, in which the physical placement is determined, using a resource of a wire and a switch included in the reconfigurable integrated circuit 1 is determined, based on the information about the connection relationship between the circuit elements. Further, a mapping file is output as an execution result of the step.

The operation from Steps S101 to S103 is performed similarly to processing such as a logic synthesis and placement and wiring of a circuit achieved by a general FPGA.

Next, an HDL file used for a simulation described later is generated (Step S104). The HDL file is generated by converting the mapping file output as the execution result of Step S103. The generated HDL file includes information about the input terminals of the plurality of first wires 110 constituting the crossbar switch. Further, the generated HDL file is used for a simulation executed in a subsequent step.

Next, an HDL simulation is performed by using the HDL generated in previous Step S104 (Step S105). The HDL simulation is executed by a general HDL simulator.

Next, a probability of occurrence of "0" or "1" included in a value to be input to the input terminals of the plurality of first wires 110 constituting the crossbar switch circuit is specified, by using the result in Step S105 (Step S106). In other words, a ratio of each of "0" and "1" to the entire values to be input to the input terminals of the plurality of first wires 110 is obtained.

When the plurality of cells 10 are included in the reconfigurable integrated circuit 1, specification of a probability is performed on each of the input terminals included in the integrated circuit 100 included in the cell 10, for example. Further, as described later, in a configuration in which one selection circuit 150 is provided for a plurality of crossbar switches, a probability is specified with, as units, a plurality of input terminals to be controlled by the selection circuit 150.

Finally, whether the selection circuit 150 selects the power supply or the ground is determined (Step S107). In other words, a value held in the control memory 153 of the selection circuit 150 is determined.

For example, when a signal to be input to the input terminals of the plurality of first wires 110 includes many "0", the selection circuit 150 selects in such a way as to connect the bias wire 130 to the ground. In other words, it is determined that "1" is held in the control memory 153 of the selection circuit 150. Further, when a signal to be input to the input terminals of the plurality of first wires 110 includes many "1", the selection circuit 150 selects in such a way as to connect the bias wire 130 to the power supply. In other words, it is determined that "0" is held in the control memory 153 of the selection circuit 150.

Figure 7:
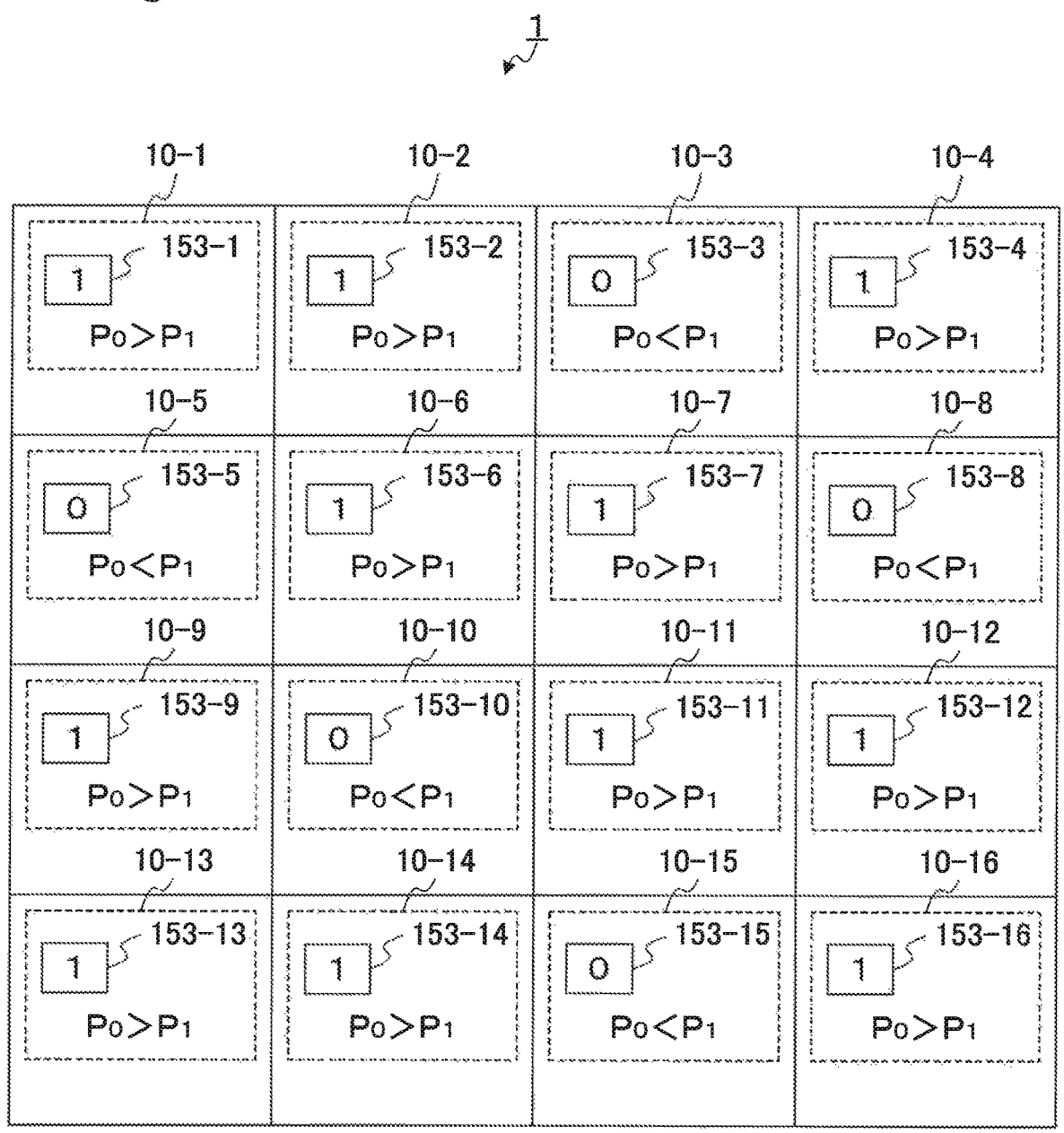
FIG. 7 is a diagram illustrating an arrangement example of a control memory of the reconfigurable integrated circuit including the integrated circuit in the first example embodiment of the present invention.

FIG. 7 is a diagram illustrating one example in which whether the selection circuit 150 selects the power supply or the ground is determined, that is, a value held in the control memory 153 is determined. FIG. 7 is an example of the reconfigurable integrated circuit 1 in which 16 numbers of cell 10 of cells 10-1 to 10-16 are provided in four rows horizontally and four columns vertically. It is assumed that the integrated circuit 100 in the present example embodiment is used as a crossbar switch circuit in each of the cells 10-1 to 10-16. In other words, in the example illustrated in FIG. 7, 16 numbers of control memory 153 of control memories 153-1 to 153-16 are provided. Then, a value to be held in each of the control memories 153-1 to 153-16 is determined by the above-described procedure.

In the example illustrated in FIG. 7, a probability of occurrence of "0" or "1" included in a value input to an input terminal (namely, the input terminal of each of the plurality of first wires 110) of the crossbar switch circuit included in each of the cells 10-1 to 10-16 is described as $P_0$ or $P_1$, respectively.

Further, when a probability of occurrence of "0" in a signal to be input to each of the input terminals in each of the cells 10-1 to 10-16 is higher than a probability of occurrence of "1" by comparison, it is indicated that $P_0 > P_1$. Similarly, when a probability of occurrence of "1" in a signal to be input to each of the input terminals in each of the cells 10-1 to 10-16 is higher than a probability of occurrence of "0" by comparison, it is indicated that $P_0 < P_1$.

Then, when a cell 10 has $P_0 > P_1$ as a relationship of the probability of occurrence of "0" or "1", a value held in the control memory 153 included in the cell 10 is "1". Further, when a cell 10 has $P_0 < P_1$ as a relationship of the probability of occurrence of "0" or "1", a value held in the control memory 153 included in the cell 10 is "0".

In the example illustrated in FIG. 7, a value held in the control memory 153 included in 11 numbers of cell 10 among 16 cells of the cells 10-1 to 10-16 is "1". Further, a value held in the control memory 153 included in remaining 5 numbers of cell 10 among 16 cells of the cells 10-1 to 10-16 is "0".

Arrangement of Control Memory

As described above, the plurality of cells 10 are generally provided in the reconfigurable integrated circuit 1 illustrated in FIG. 2. In other words, when the integrated circuit 100 in the present example embodiment is used as the routing block included in the cell 10 of the reconfigurable integrated circuit 1, the plurality of integrated circuits 100 are included in the reconfigurable integrated circuit 1. Then, in this case, the control memory 153 of the selection circuit 150 is provided for each of the plurality of integrated circuits 100, as in the example of FIG. 7 described above.

In the example illustrated in FIG. 7, when the control memory 153 is provided in each of the cells 10, a value held in the control memory 153 is determined according to an input to an individual crossbar switch constituting the routing block 11 of the cell 10. In other words, a potential of the bias wire 130 is determined according to an input to an individual crossbar switch. Therefore, an effect of reducing a leakage current increases. However, the control memory 153 is provided in the individual cell 10 in the example illustrated in FIG. 7. Therefore, overhead may be caused in the control memory 153 in terms of an area.

Thus, various examples different from the example of FIG. 7 are assumed as arrangement of the control memory 153 of the selection circuit included in a circuit including the plurality of integrated circuits 100. In other words, when the plurality of integrated circuits 100 are included, it is assumed that one control memory 153 is arranged for the plurality of integrated circuits 100, for example.

Arrangement examples of the control memory 153 are described by using FIGS. 8 to 11. In the examples illustrated in FIGS. 8 to 11, it is assumed that 16 numbers of cell 10 are arranged in an array pattern, and constitute the reconfigurable integrated circuit 1. In the examples illustrated in FIGS. 8 to 11, one cell is explicitly illustrated as one example. Then, it is assumed that the integrated circuit 100 is used as the routing block 11 of the cell 10. In other words, elements except for the control memory 153 of the integrated circuit 100 are included in each of the cells 10. Note that, the number of the cells 10 included in the reconfigurable integrated circuit 1 is not particularly limited in the examples illustrated in FIGS. 8 to 11.

Figure 8:
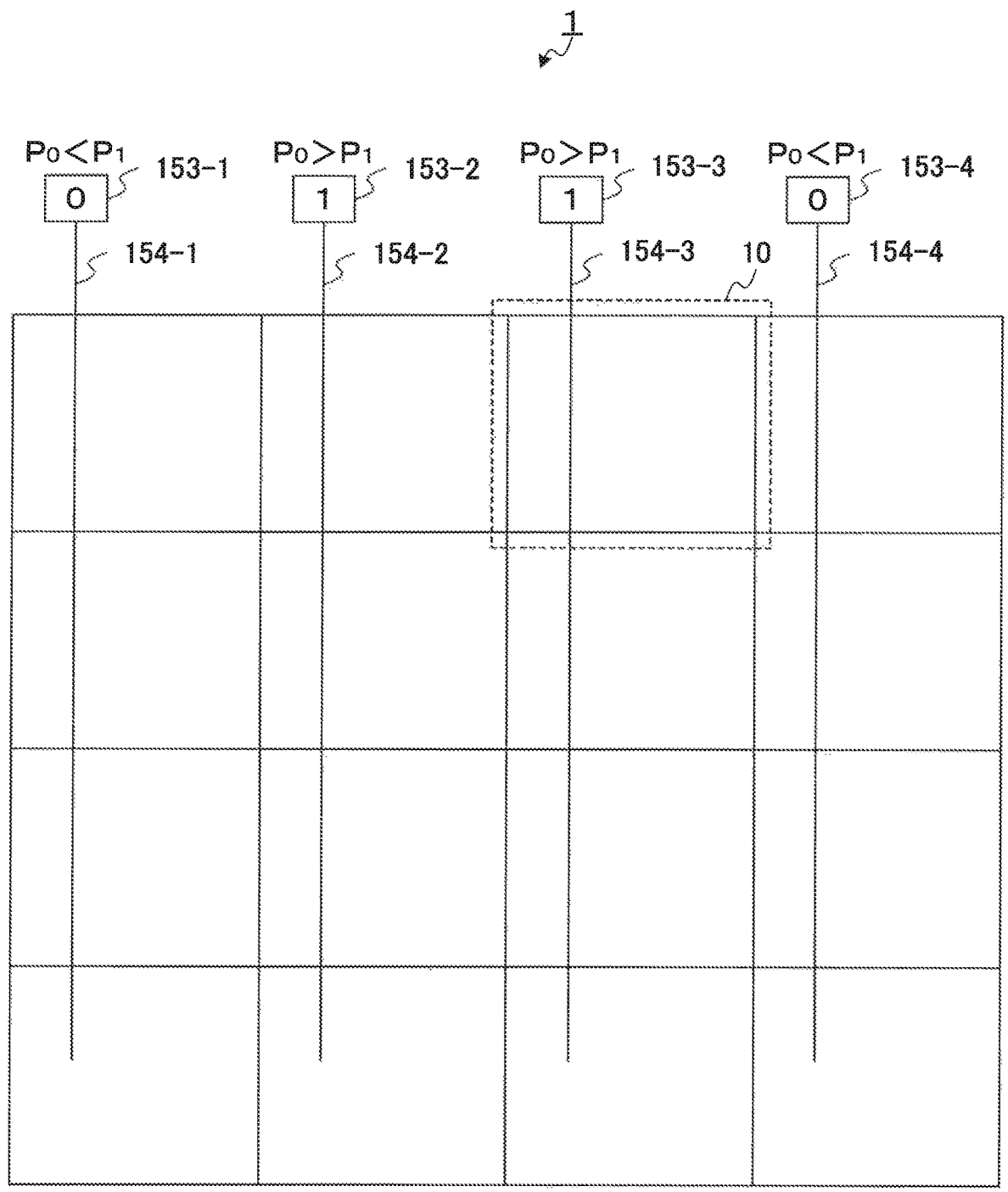
FIG. 8 is a diagram illustrating another arrangement example of a control memory of the reconfigurable integrated circuit including the integrated circuit in the first example embodiment of the present invention.

FIG. 8 illustrates an example in which one control memory 153 is provided for each column of the cells 10 included in the reconfigurable integrated circuit 1. In other words, in the example illustrated in FIG. 8, 4 control memories 153 of control memories 153-1 to 153-4 are provided. The control memories 153-1 to 153-4 are connected to each of the PMOS transistor 151 and the NMOS transistor 152 of the integrated circuit 100 included in each of the cells 10 to be controlled via respective selection wires 154-1 to 154-4. In other words, opening and closing of the PMOS transistor 151 and the NMOS transistor 152 of the integrated circuit 100 included in each of the cells 10 are controlled, based on a value of any of the control memories 153-1 to 153-4. In this case, a value held in each of the control memories 153 is determined, based on a probability of occurrence of "0" or "1" included in an input to a crossbar switch included in the cell 10 in each column to be controlled by the control memory 153.

In the example in FIG. 8, "0" is held in the control memories 153 provided in the two columns farthest to the left or right. Further, in this example, "1" is held in the control memories 153 provided in the two central columns.

Figure 9:
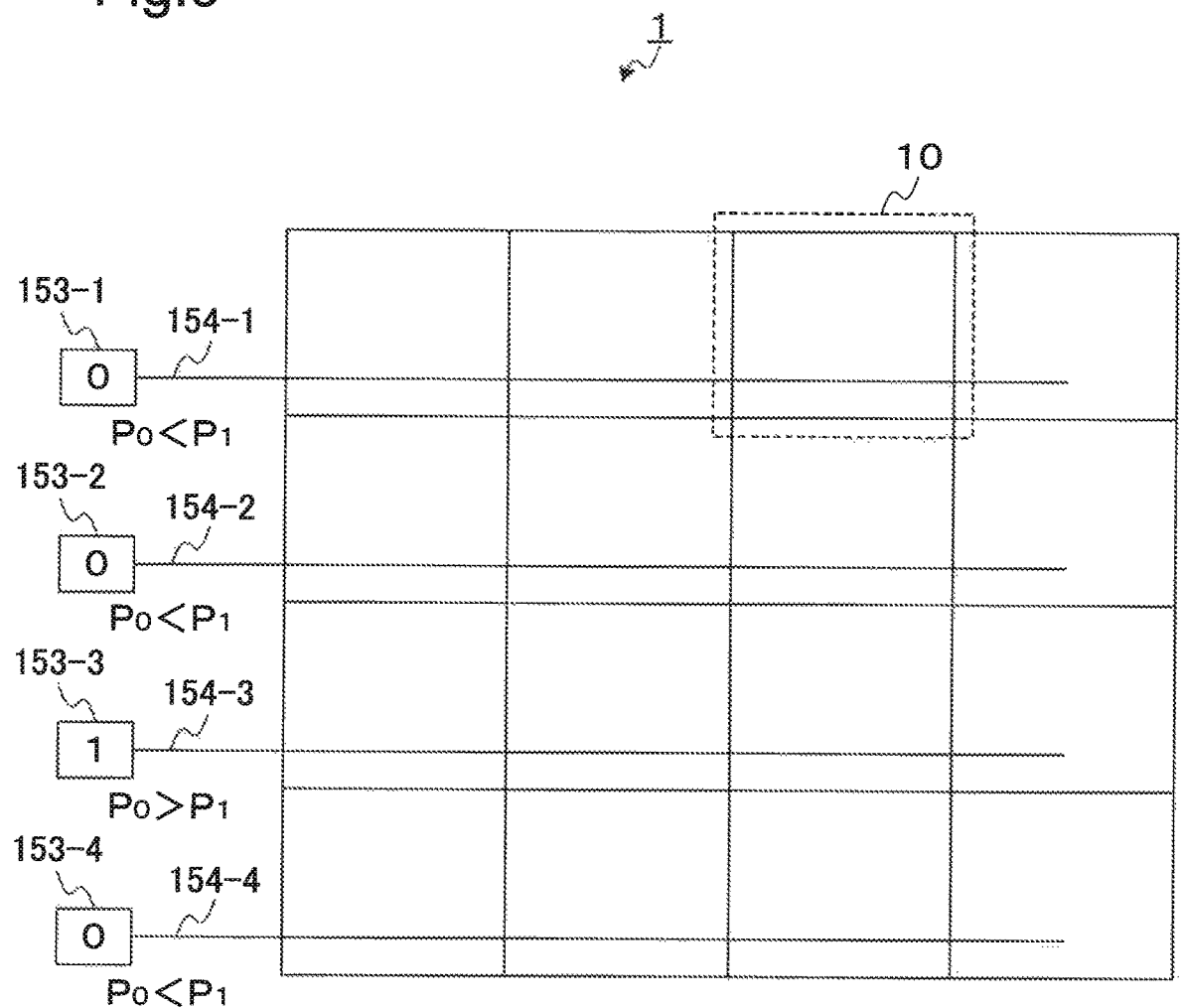
FIG. 9 is a diagram illustrating another arrangement example of a control memory of the reconfigurable integrated circuit including the integrated circuit in the first example embodiment of the present invention.

FIG. 9 illustrates an example in which one control memory 153 is provided for each row of the cells 10 included in the reconfigurable integrated circuit 1. The reconfigurable integrated circuit 1 illustrated in FIG. 9 has a configuration similar to that of the reconfigurable integrated circuit illustrated in FIG. 8, except for a point that the cells 10 to be controlled by each of control memories 153-1 to 153-4 are different. In other words, the control memories 153-1 to 153-4 are connected to each of the PMOS transistor 151 and the NMOS transistor 152 included in each of the cells 10 to be controlled, via respective selection wires 154-1 to 154-4. Also, in this case, a value held in each of the control memories 153 is determined, based on a probability of occurrence of "0" or "1" included in an input to a crossbar switch included in the cell 10 in each row to be controlled by the control memory 153.

Figure 10:
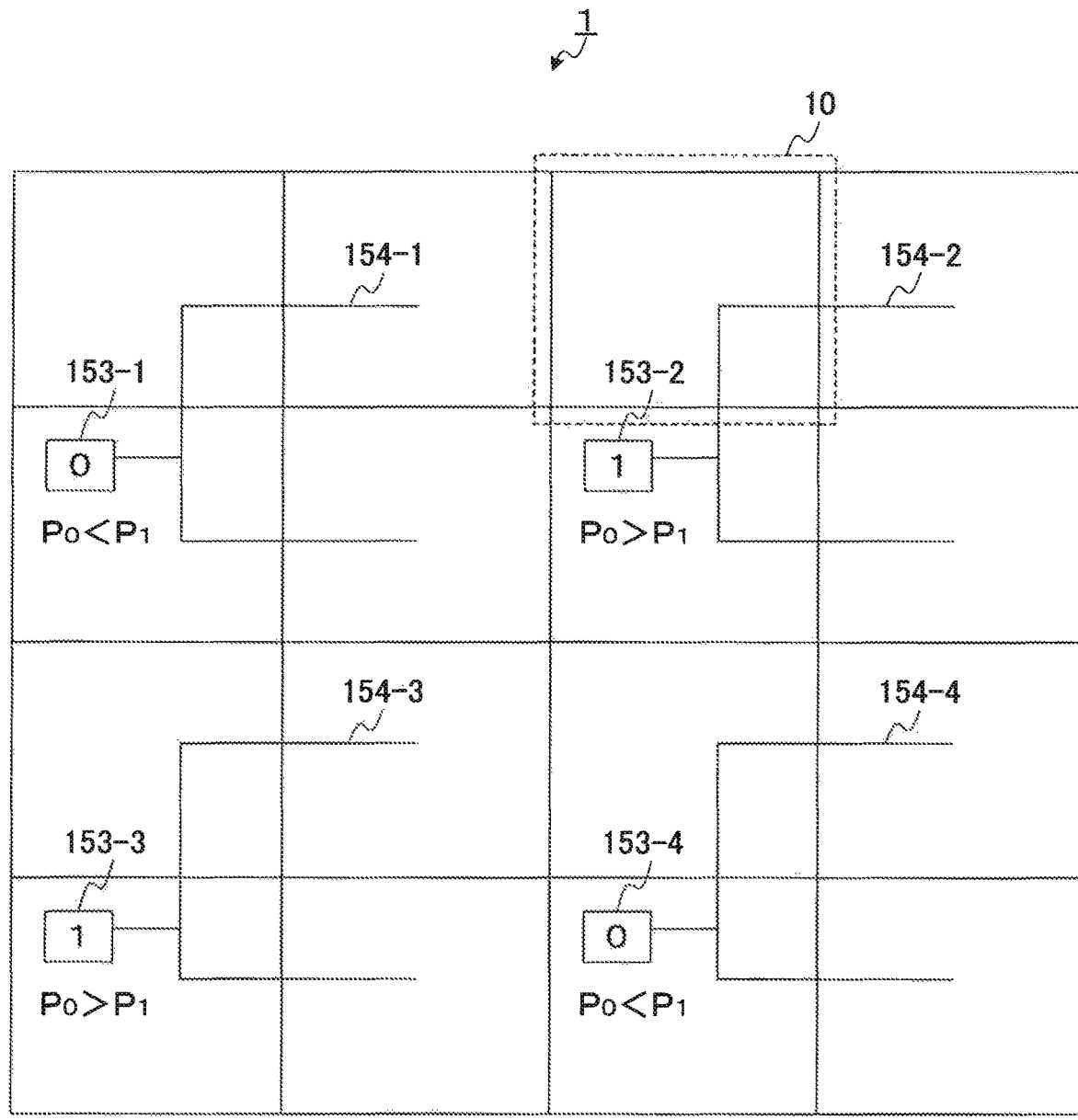
FIG. 10 is a diagram illustrating another arrangement example of a control memory of the reconfigurable integrated circuit including the integrated circuit in the first example embodiment of the present invention.

Further, FIG. 10 illustrates an example in which one control memory 153 is provided for four adjacent cells 10 among the cells 10 included in the reconfigurable integrated circuit 1. The reconfigurable integrated circuit 1 illustrated in FIG. 10 has a configuration similar to that of the reconfigurable integrated circuit illustrated in FIG. 8 or 9 except for a point that the cells 10 to be controlled by each of control memories 153-1 to 153-4 are different. In other words, the control memories 153-1 to 153-4 are connected to each of the PMOS transistor 151 and the NMOS transistor 152 included in each of the cells 10 to be controlled, via respective selection wires 154-1 to 154-4. Also, in this case, a value held in each of the control memories 153 is determined, based on a probability of occurrence of "0" or "1" included in an input to a crossbar switch included in the cell 10 to be controlled by the control memory 153.

Figure 11:
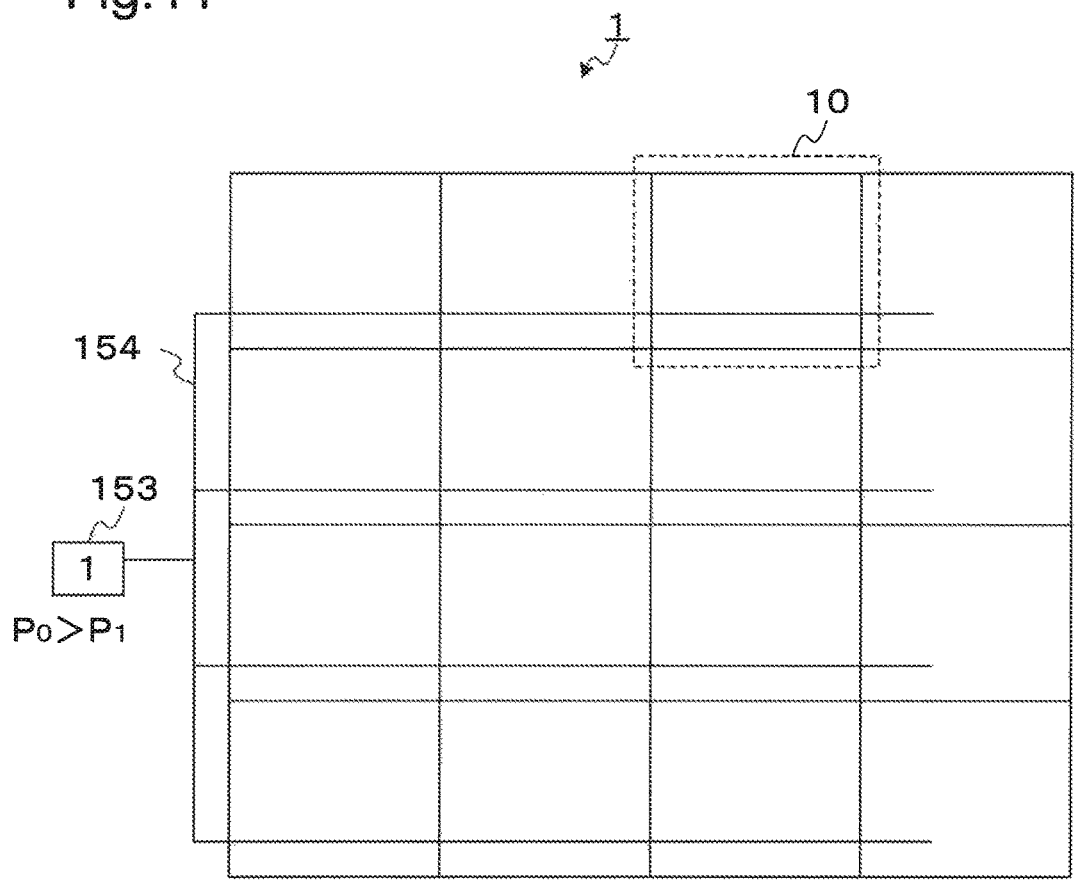
FIG. 11 is a diagram illustrating another arrangement example of a control memory of the reconfigurable integrated circuit including the integrated circuit in the first example embodiment of the present invention.

Further, FIG. 11 illustrates an example in which one control memory 153 is provided for all the cells 10 included in the reconfigurable integrated circuit 1. The control memory 153 is connected to each of the PMOS transistor 151 and the NMOS transistor 152 of the integrated circuit 100 included in each of all the cells 10 included in the reconfigurable integrated circuit 1, via a selection wire 154. In other words, opening and closing of the PMOS transistor 151 and the NMOS transistor 152 of the integrated circuit 100 included in each of all the cells 10 are controlled, based on a value of the control memory 153. In this case, a value held in the control memory 153 is determined, based on a probability of occurrence of "0" or "1" included in an input to a crossbar switch included in all the cells 10.

In the examples illustrated in FIGS. 8 to 11, a fewer number of the control memories 153 reduces an area needed for the control memory 153, on the assumption that the number of cells 10 included in the reconfigurable integrated circuit 1 is the same. On the other hand, a fewer number of the control memories 153 tends to decrease the effect of reducing a leakage current. In other words, the number and arrangement of the control memories 153 are determined according to a trade-off between reduction in a leakage current and an area of the control memory 153. Further, the arrangement of the control memory 153 may be different from that in the above-described examples.

Configuration of Control Memory

Figure 12:
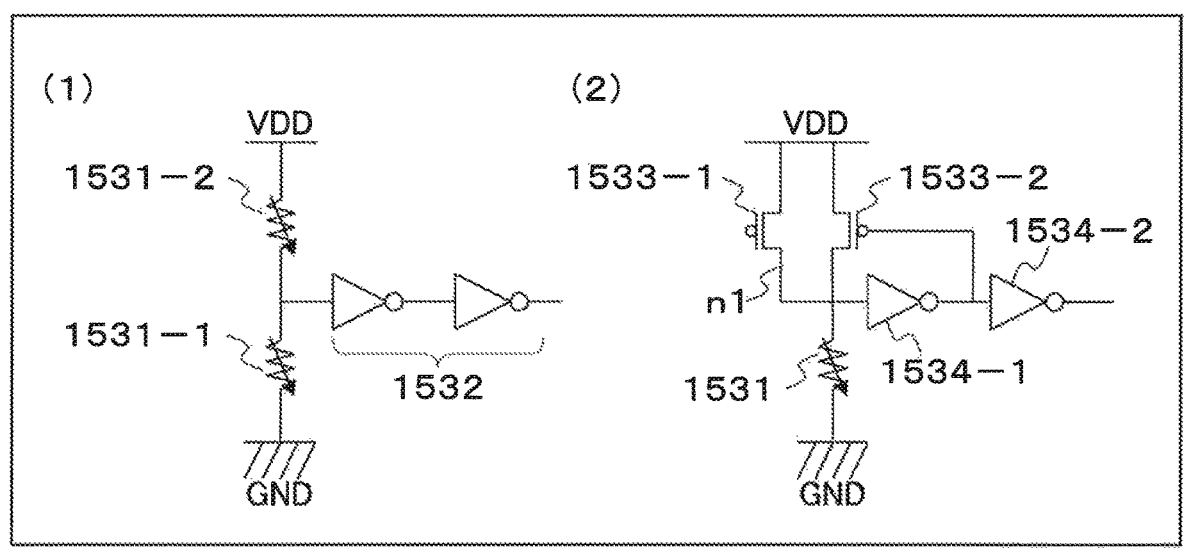
FIG. 12 is a diagram illustrating an example of a circuit of the control memory provided in the integrated circuit in the first example embodiment of the present invention.

A circuit having various configurations is used as the control memory 153 of the selection circuit 150 included in the integrated circuit 100. FIG. 12 illustrates a configuration example of the control memory 153.

In an example illustrated in (1) of FIG. 12, the control memory 153 is constituted of two variable resistance elements 1531-1 and 1531-2 and a buffer 1532.

In this example, when the variable resistance element 1531-1 is ON (state of a small resistance value) and the variable resistance element 1531-2 is OFF (state of a great resistance value), the buffer 1532 is electrically connected to a ground GND. In this case, a value "0" is held in the buffer 1532. Further, when the variable resistance element 1531-1 is OFF and the variable resistance element 1531-2 is ON, the buffer 1532 is electrically connected to a power supply VDD. In this case, a value "1" is held in the buffer 1532. Then, the value held in the buffer 1532 becomes a value held in the control memory 153.

The control memory 153 can be achieved in a relatively small area by using the circuit having the configuration illustrated in (1) of FIG. 12. However, when a failure occurs in such a way that at least one of the variable resistance elements 1531-1 and 1531-2 is fixed to be ON or OFF, a malfunction such as generation of a flow-through current and a floating problem of the buffer 1532 may occur.

In an example illustrated in (2) of FIG. 12, the control memory 153 is constituted of a variable resistance element 1531, two PMOS transistors 1533-1 and 1533-2, and two NOT gates 1534-1 and 1534-2. The PMOS transistor 1533-1 is used as a precharge transistor. Further, the PMOS transistor 1533-2 and the NOT gate 1534-1 constitutes a feedback loop, and are used as self-holding circuits.

In this example, a pulse signal is applied to a gate terminal of the PMOS transistor 1533-1, and thus a wire n1 that connects the PMOS transistor 1533-1 to the NOT gate 1534-1 and the like is precharged. In this case, assuming that the variable resistance element 1531 is OFF (state of a great resistance value), the wire n1 remains as a high potential, and the self-holding circuits constituted by the PMOS transistor 1533-2 and the NOT gate 1534-1 hold "1". As a result, an output from the NOT gate 1534-2 is "1". This value is an output from the control memory 153.

On the other hand, assuming that the variable resistance element 1531 is ON (state of a small resistance value), the wire n1 is electrically connected to a ground GND and becomes a low potential. As a result, the self-holding circuits constituted by the PMOS transistor 1533-2 and the NOT gate 1534-1 hold "0". As a result, an output from the NOT gate 1534-2 is "0".

The circuit having the configuration illustrated in (2) of FIG. 12 may have a greater area due to an increase in the number of transistors in comparison with the circuit having the configuration illustrated in (1) of FIG. 12. However, a problem such as a flow-through current and floating is less likely to occur in the circuit having this configuration, even when a failure occurs in such a way that the variable resistance element 1531 is fixed to be ON or OFF. Therefore, the circuit having the configuration illustrated in (2) of FIG. 12 is a circuit having a higher degree of stability than that of the circuit having the configuration illustrated in (1) of FIG. 12.

EXAMPLE

A simulation program with integrated circuit emphasis (HSPICE) simulation was performed on the integrated circuit 100 in the present example embodiment.

In the present example, it was assumed that a switch 140 of the integrated circuit 100 was a variable resistance element, and the integrated circuit 100 was achieved by a CMOS/variable resistance element hybrid process of 65 nanometers (nm). Then, a potential applied to a bias wire 130 was changed according to a ratio of "0" or "1" included in an input to an input terminal of a crossbar switch included in the integrated circuit 100.

Specifically, when "0" included in the input was greater than or equal to 50%, the bias wire 130 was electrically connected to a ground GND, and a low potential was applied. Further, when "0" included in the input was less than 50%, the bias wire 130 was electrically connected to a power supply VDD, and a high potential was applied.

It was assumed that a comparative example was achieved by a process similar to that of the integrated circuit 100, and a potential applied to the bias wire 130 was fixed. In a comparative example (1), the bias wire 130 was fixed at a low potential. Further, in a comparative example (2), the bias wire 130 was fixed at a high potential.

Figure 13:
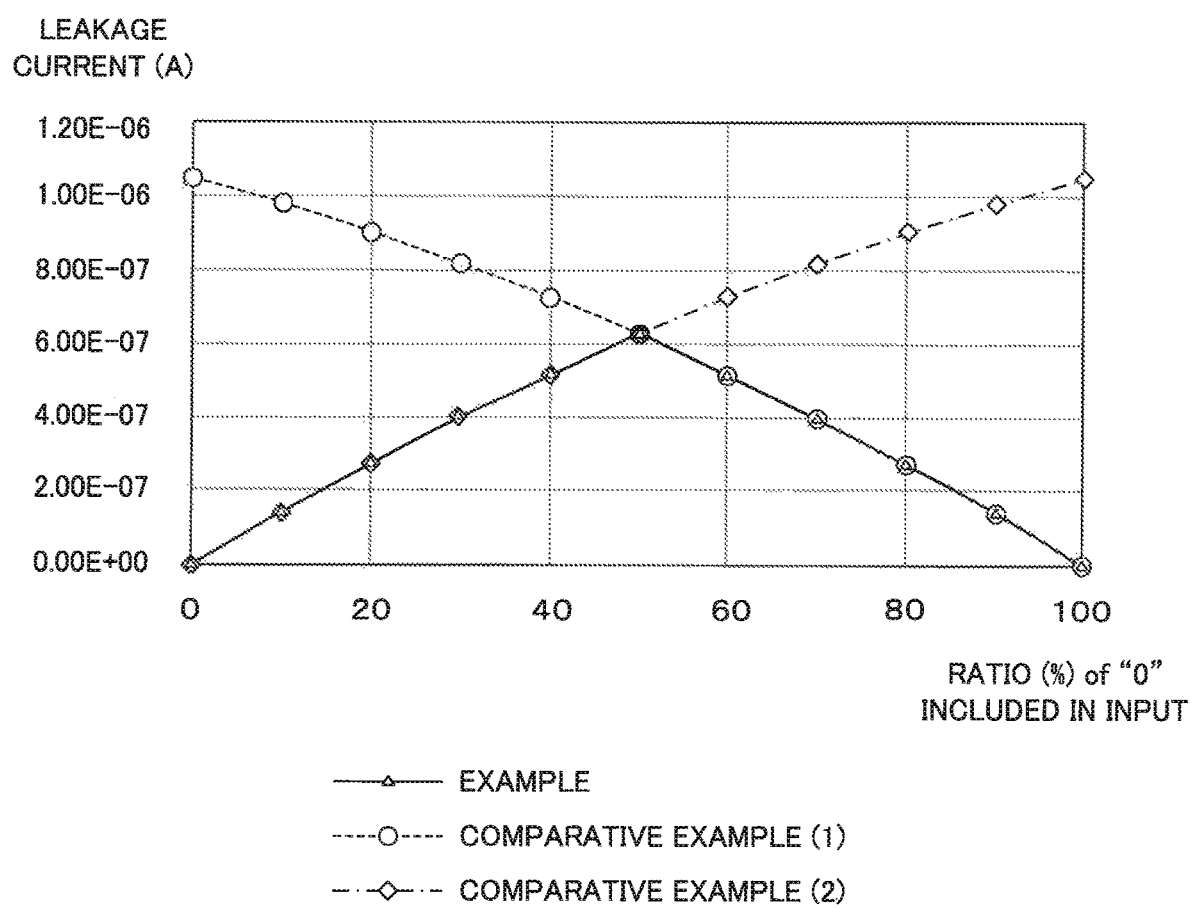
FIG. 13 is a diagram illustrating a simulation result of a leakage current generated in the integrated circuit in the first example embodiment of the present invention and circuits as comparative examples.

A leakage current in this case was as in FIG. 13. In FIG. 13, a horizontal axis represents a ratio of "0" included in an input to an input terminal of a crossbar switch. Further, a vertical axis represents magnitude of a leakage current.

As illustrated in FIG. 13, when "0" included in the input was less than 50%, the integrated circuit 100 in the present example embodiment had magnitude of a leakage current smaller than that of the comparative example (1). Further, when "0" included in the input was greater than or equal to 50%, the integrated circuit 100 in the present example embodiment had magnitude of a leakage current smaller than that of the comparative example (2). In other words, it was indicated that the integrated circuit 100 in the present example embodiment could reduce a leakage current, in comparison with a case where a potential applied to the bias wire 130 was fixed.

As described above, the integrated circuit 100 in the present example embodiment includes the selection circuit 150. The selection circuit 150 can select a potential applied to the bias wire 130 provided in the crossbar switch being an element of the integrated circuit 100. In other words, the selection circuit 150 performs control in such a way that a potential applied to the bias wire 130 is selected according to a ratio of "0" or "1" included in an input to an input terminal of the crossbar switch. By performing such control, a leakage current due to the bias wire 130 is reduced.

Therefore, the integrated circuit 100 in the present example embodiment is an integrated circuit having reduced power consumption.

A part or the whole of the invention may also be described in supplementary notes below, which is not limited thereto.

Supplementary Note 1

An integrated circuit comprising:
a plurality of first wires each having one end used as an input terminal;
a plurality of second wires that each have one end used as an output terminal and are each connected to each of the first wires;
a bias wire connected to each of the second wires and connected to a power supply or a ground;
a plurality of switches that connect the first wires or the bias wire to the second wires; and
a selection circuit that selects an electrical connection between the bias wire and either the power supply or the ground.

Supplementary Note 2

The integrated circuit according to supplementary note 1, wherein
each of the switches is a variable resistance element.

Supplementary Note 3

The integrated circuit according to supplementary note 1 or 2, wherein
the selection circuit selects an electrical connection between the bias wire and either the power supply or the ground, according to a value to be input to the input terminal.

Supplementary Note 4

The integrated circuit according to any one of supplementary notes 1 to 3, wherein
the selection circuit performs selection in such a way as to electrically connect the bias wire to the ground when a value to be input to the input terminal includes many 0, and performs selection in such a way as to connect the bias wire to the power supply when a value to be input to the input terminal includes many 1.

Supplementary Note 5

The integrated circuit according to any one of supplementary notes 1 to 4, wherein
the selection circuit includes a selection switch that electrically connects the bias wire to either the power supply or the ground, and a control memory that controls opening and closing of the selection switch.

Supplementary Note 6

The integrated circuit according to any one of supplementary notes 1 to 5, wherein
the selection switch includes a PMOS transistor that connects the bias wire to the power supply, and an NMOS transistor that connects the bias wire to the ground.

Supplementary Note 7

The integrated circuit according to any one of supplementary notes 1 to 6, wherein
the control memory includes a first variable resistance element having one end connected to the ground, a second variable resistance element having one end connected to the power supply and another end connected to the first variable resistance element, and a buffer having one end connected to a wire that connects the first variable resistance element to the second variable resistance element.

Supplementary Note 8

The integrated circuit according to any one of supplementary notes 1 to 6, wherein
the control memory includes
a first metal oxide semiconductor (PMOS) transistor having one end connected to the power supply, and a second PMOS transistor having one end connected to the power supply and another end connected to the first PMOS transistor,
a first NOT gate having an input connected to a wire that connects the first PMOS transistor to the second PMOS transistor and an output connected to a gate terminal of the second PMOS transistor,
a second NOT gate having an input connected to an output of the first NOT gate, and
a variable resistance element having one end connected to a wire that connects the first PMOS transistor to the second PMOS transistor and another end connected to the ground.

Supplementary Note 9

A reconfigurable integrated circuit comprising:
a plurality of cell circuits arranged in an array pattern, wherein
each of the plurality of cell circuits includes
the integrated circuit according to any one of supplementary notes 1 to 8, and
a logic block that is connected to the output terminal of the integrated circuit and includes at least a look up table (LUT) and a flip-flop.

Supplementary Note 10

A reconfigurable integrated circuit comprising:
a plurality of cell circuits and at least one control memory, wherein
each of the plurality of cell circuits includes
a first wire including a plurality of first wires each having one end used as an input terminal,
a plurality of second wires that each have one end used as an output terminal and are each connected to each of the first wires,
a bias wire connected to each of the second wires and connected to a power supply or a ground,
a plurality of switches that connect the first wire or the bias wire to the second wires,
a selection switch that electrically connects the bias wire to either the power supply or the ground, and
a logic block that is connected to the output terminal of the integrated circuit and includes at least a look up table (LUT) and a flip-flop, and each of the control memories controls opening and closing of the selection switch provided in at least one of the cell circuits.

Supplementary Note 11

A determination method of determining whether a selection circuit provided in the reconfigurable integrated circuit according to supplementary note 9 or 10 selects an electrical connection between the bias wire and either the power supply or the ground, the determination method including:

executing a simulation of a circuit achieved by the reconfigurable integrated circuit;

specifying a probability of occurrence of 0 or 1 included in a value to be input to each of the input terminals provided in the reconfigurable integrated circuit, based on a result of the simulation; and determining whether the selection circuit selects an electrical connection to the power supply or the ground, based on the specified probability.

Although the present invention is described with reference to the example embodiment, it should be understood that the present invention is not limited to the above-described example embodiment. Various modifications that can be understood by those skilled in the art within the scope of the present invention may be applied to the configuration and the details of the present invention. Further, the configurations in respective example embodiments can be combined with each other without departing from the scope of the present invention.

REFERENCE SIGNS LIST

1 Reconfigurable integrated circuit
10 Cell
11 Routing block
12 Logic block
100 Integrated circuit
110 First wire
120 Second wire
130 Bias wire
140 Switch
141 Variable resistance element
150 Selection circuit
151 PMOS transistor
152 NMOS transistor
153 Control memory
1531 Variable resistance element
1532 Buffer
1533 PMOS transistor
1534 NOT gate
154 Selection wire

The invention claimed is:

1. An integrated circuit comprising:
a plurality of first wires each having one end used as an input terminal;
a plurality of second wires that each have one end used as an output terminal and are each connected to each of the first wires;
a bias wire connected to each of the second wires and connected to a power supply or a ground;
a plurality of switches that connect the first wires or the bias wire to the second wires; and
a selection circuit that selects an electrical connection between the bias wire and either the power supply or the ground.

2. The integrated circuit according to claim 1, wherein each of the switches is a variable resistance element.

3. The integrated circuit according to claim 1, wherein the selection circuit selects an electrical connection between the bias wire and either the power supply or the ground, according to a value to be input to the input terminal.

4. The integrated circuit according to claim 1, wherein the selection circuit performs selection in such a way as to electrically connect the bias wire to the ground when a value to be input to the input terminal includes many 0, and performs selection in such a way as to connect the bias wire to the power supply when a value to be input to the input terminal includes many 1.

5. The integrated circuit according to claim 1, wherein the selection circuit includes a selection switch that electrically connects the bias wire to either the power supply or the ground, and a control memory that controls opening and closing of the selection switch.

6. The integrated circuit according to claim 5, wherein the selection switch includes a PMOS transistor that connects the bias wire to the power supply, and an NMOS transistor that connects the bias wire to the ground.

7. The integrated circuit according to claim 5, wherein the control memory includes a first variable resistance element having one end connected to the ground, a second variable resistance element having one end connected to the power supply and another end connected to the first variable resistance element, and a buffer having one end connected to a wire that connects the first variable resistance element to the second variable resistance element.

8. The integrated circuit according to claim 5, wherein the control memory includes
a first metal oxide semiconductor (PMOS) transistor having one end connected to the power supply, and a second PMOS transistor having one end connected to the power supply and another end connected to the first PMOS transistor,
a first NOT gate having an input connected to a wire that connects the first PMOS transistor to the second PMOS transistor and an output connected to a gate terminal of the second PMOS transistor,
a second NOT gate having an input connected to an output of the first NOT gate, and
a variable resistance element having one end connected to a wire that connects the first PMOS transistor to the second PMOS transistor and another end connected to the ground.

9. A reconfigurable integrated circuit comprising:
a plurality of cell circuits arranged in an array pattern, wherein
each of the plurality of cell circuits includes
the integrated circuit according to claim 1, and
a logic block that is connected to the output terminal of the integrated circuit and includes at least a look up table (LUT) and a flip-flop.

10. A reconfigurable integrated circuit comprising:
a plurality of cell circuits and at least one control memory, wherein
each of the plurality of cell circuits includes
a first wire including a plurality of first wires each having one end used as an input terminal,
a plurality of second wires that each have one end used as an output terminal and are each connected to each of the first wires, a bias wire connected to each of the second wires and connected to a power supply or a ground, a plurality of switches that connect the first wire or the bias wire to the second wires, a selection switch that electrically connects the bias wire to either the power supply or the ground, and a logic block that is connected to the output terminal of an integrated circuit and includes at least a look up table (LUT) and a flip-flop, and wherein each of the control memories controls opening and closing of the selection switch provided in at least one of the cell circuits.

11. A determination method of determining whether a selection circuit provided in the reconfigurable integrated circuit according to claim 9 selects an electrical connection between the bias wire and either the power supply or the ground, the determination method including:

executing a simulation of a circuit achieved by the reconfigurable integrated circuit;

specifying a probability of occurrence of 0 or 1 included in a value to be input to each of the input terminals provided in the reconfigurable integrated circuit, based on a result of the simulation; and determining whether the selection circuit selects an electrical connection to the power supply or the ground, based on the specified probability.

* * * * *

UNITED STATES PATENT AND TRADEMARK OFFICE
CERTIFICATE OF CORRECTION

PATENT NO. : 10,720,925 B2
APPLICATION NO. : 16/333317
DATED : July 21, 2020
INVENTOR(S) : Xu Bai et al.

Page 1 of 1

It is certified that error appears in the above-identified patent and that said Letters Patent is hereby corrected as shown below:

In the Specification

Column 1, Cross Reference to Related Applications, Line 7; Delete "PCT/JB2017/032669," and insert --PCT/JP2017/032669,-- therefor Signed and Sealed this
Seventeenth Day of November, 2020

Andrei Iancu
*Director of the United States Patent and Trademark Office*